US009787306B2

(12) United States Patent
Muzzetto

(10) Patent No.: US 9,787,306 B2
(45) Date of Patent: Oct. 10, 2017

(54) SIMPLIFIED CAPACITIVE SENSOR UNIT

(71) Applicant: HUF HÜLSBECK & FÜRST GMBH & CO. KG, Velbert (DE)

(72) Inventor: Mario Muzzetto, Solingen (DE)

(73) Assignee: HUF HÜLSBECK & FÜRST GMBH & CO. KG, Velbert (DE)

(*) Notice: Subject to any disclaimer, the term of this patent is extended or adjusted under 35 U.S.C. 154(b) by 63 days.

(21) Appl. No.: 14/767,196

(22) PCT Filed: Feb. 12, 2014

(86) PCT No.: PCT/EP2014/052764
§ 371 (c)(1),
(2) Date: Aug. 11, 2015

(87) PCT Pub. No.: WO2014/124995
PCT Pub. Date: Aug. 21, 2014

(65) Prior Publication Data
US 2016/0049932 A1  Feb. 18, 2016

(30) Foreign Application Priority Data
Feb. 12, 2013 (DE) .................. 10 2013 101 374

(51) Int. Cl.
*H03K 17/955* (2006.01)
*G01D 5/24* (2006.01)
*H03K 17/945* (2006.01)

(52) U.S. Cl.
CPC .............. *H03K 17/955* (2013.01); *G01D 5/24* (2013.01); *H03K 2017/9455* (2013.01); *H03K 2217/96078* (2013.01)

(58) Field of Classification Search
CPC .................. G01D 5/24; H03K 17/955; H03K 2017/9455; H03K 2217/96078; G01R 27/2605

(Continued)

(56) References Cited

U.S. PATENT DOCUMENTS 4,392,104 A * 7/1983 Lewis ................ G01R 31/1272
                                                    324/518
6,700,393 B2 * 3/2004 Haag ....................... E05F 15/46
                                                    324/658

(Continued)

FOREIGN PATENT DOCUMENTS

DE    20 2008 009942 U1   12/2008
DE    WO 2011117413 A1 *  9/2011 ............. G01R 27/02

(Continued)

OTHER PUBLICATIONS

Kuhnen, Thorsten; Translation of Sensor Unit for Remotely Actuating a Vehicle Door; Jul. 19, 2012; EPO and Google.*
International Search Report, International Preliminary Report on Patentability and Written Opinion, issued in International Patent Application No. PCT/EP2014/052764, mailed Aug. 18, 2015.

*Primary Examiner* — Melissa Koval
*Assistant Examiner* — Rahul Maini
(74) *Attorney, Agent, or Firm* — Michael Ye; Andrews Kurth Kenyon LLP

(57) ABSTRACT

The invention relates to a sensor unit (10) for actuating an actuating element (102), in particular a hatch (101) or similar of a vehicle (100), without contact, comprising at least one capacitive sensor element (11, 12), wherein the sensor element (11, 12) has a wire (13), which is arranged on a support element (14). The support element (14) has at least one electrically conductive core (18). The invention also relates to a security system (100), in particular, for opening and/or closing a hatch (101) of a vehicle or similar without contact, comprising at least one such sensor unit (10). The invention also relates to a method for producing such a sensor unit (10).

26 Claims, 10 Drawing Sheets

Figure 2:
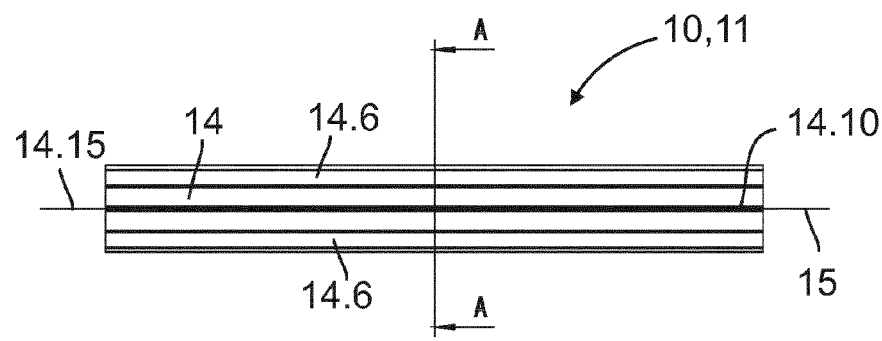

(58) Field of Classification Search
USPC .......................................................... 324/686
See application file for complete search history.

(56) References Cited

U.S. PATENT DOCUMENTS

| | | | | |
|---|---|---|---|---|
| 6,842,018 | B2* | 1/2005 | McIntosh | G01D 5/2405 |
| | | | | 324/658 |
| 7,199,317 | B2* | 4/2007 | Ieda | E05B 81/78 |
| | | | | 200/600 |
| 8,354,851 | B2* | 1/2013 | Schlechtriemen ... | G01D 5/2405 |
| | | | | 324/686 |
| 8,382,170 | B2* | 2/2013 | Ieda | E05B 81/78 |
| | | | | 292/336.3 |
| 2003/0128116 | A1* | 7/2003 | Ieda | H03K 17/955 |
| | | | | 340/562 |
| 2009/0295410 | A1 | 12/2009 | Sakamaki | |

FOREIGN PATENT DOCUMENTS

| | | | |
|---|---|---|---|
| DE | 10 2010 038705 A1 | 2/2012 | |
| DE | 10 2010 049400 A1 | 4/2012 | |
| DE | 10 2010 060364 A1 | 5/2012 | |
| DE | WO 2012095158 A1 * | 7/2012 | ......... G01R 27/2605 |

* cited by examiner

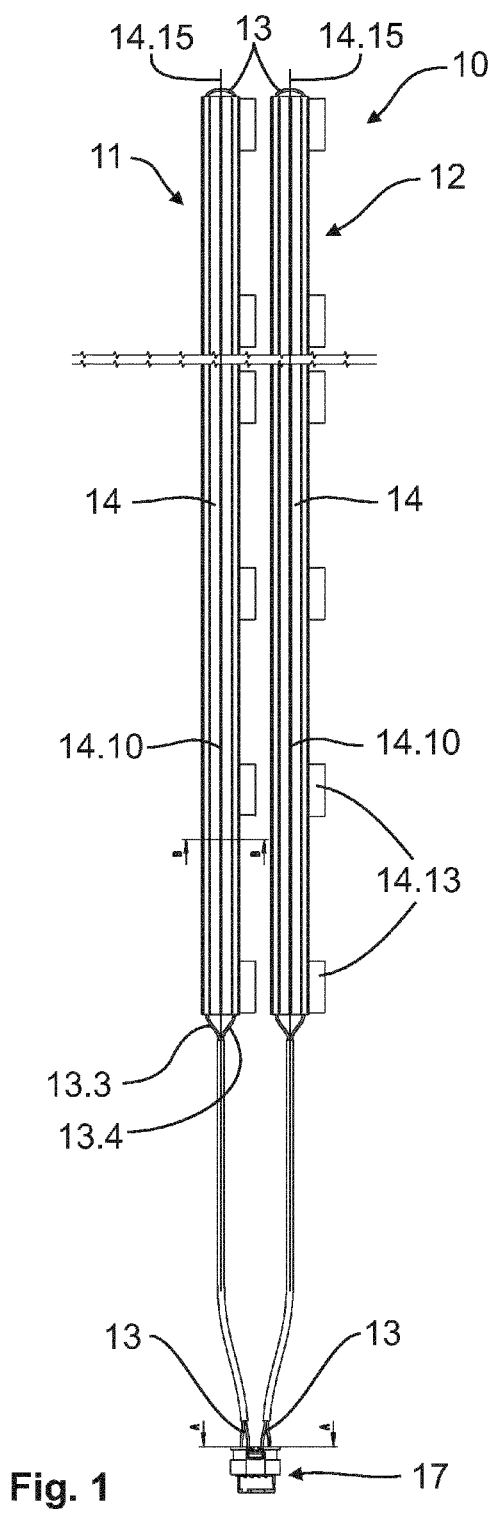
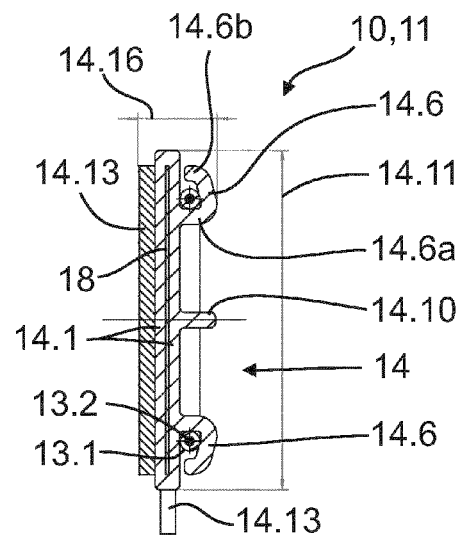
Fig. 1b
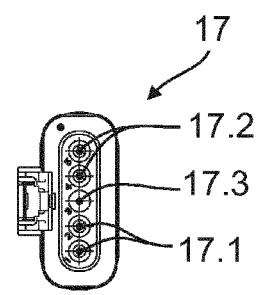
Fig. 1a
Fig. 1

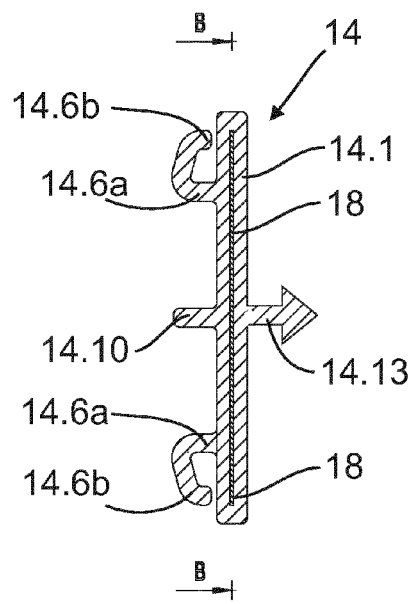
Fig. 3
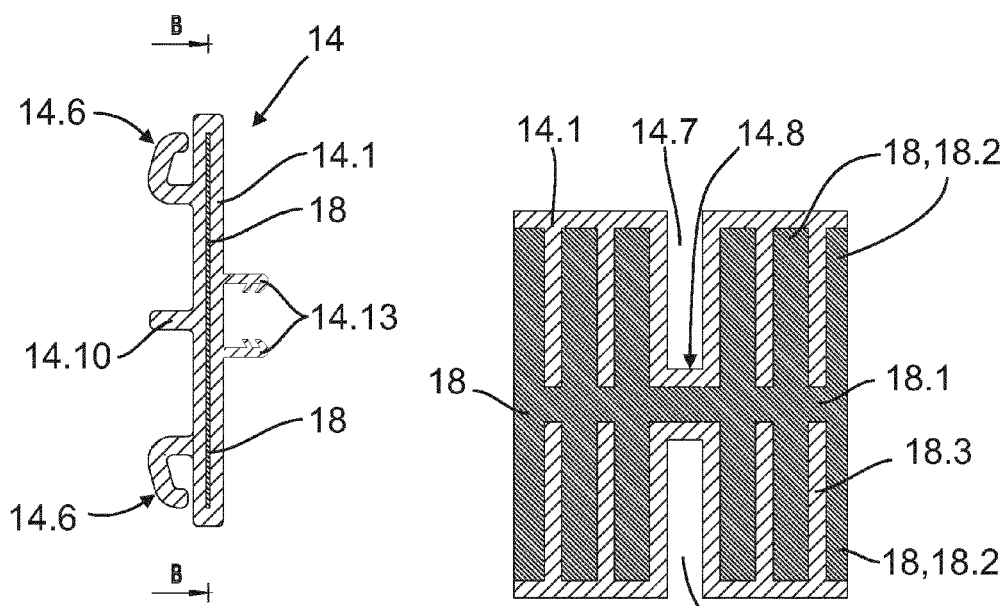
Fig. 4a  Fig. 4b

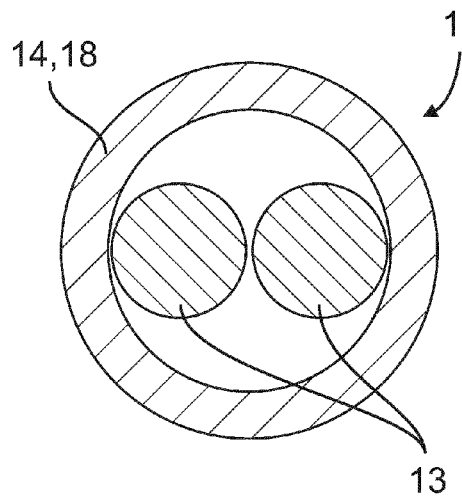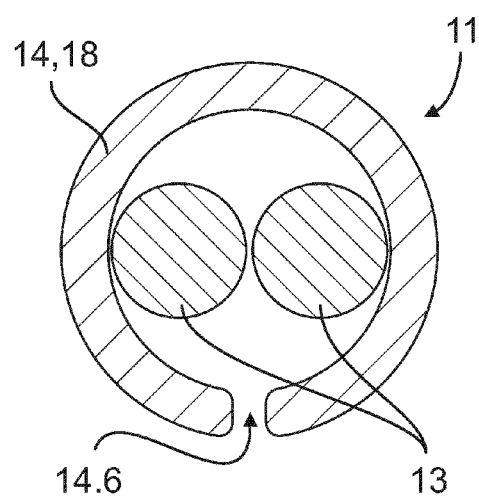
Fig. 12a    Fig. 12b
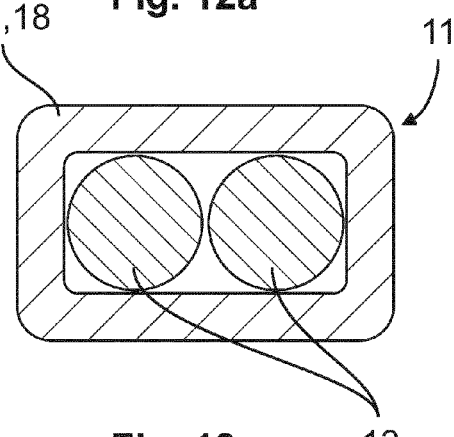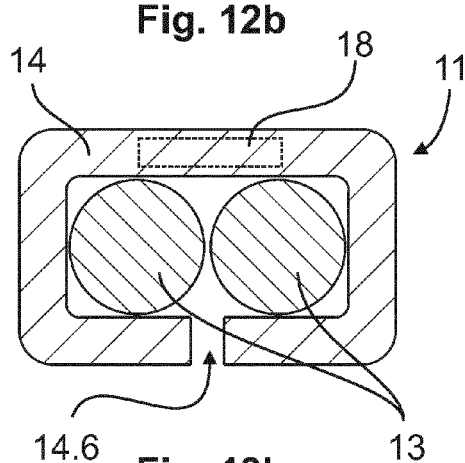
Fig. 13a    Fig. 13b
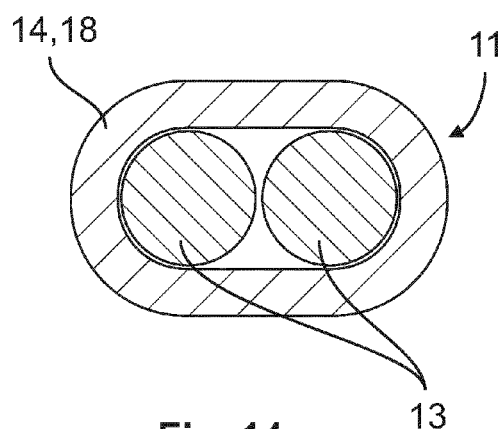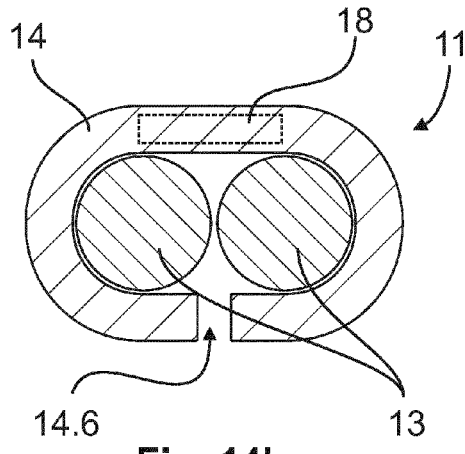
Fig. 14a    Fig. 14b

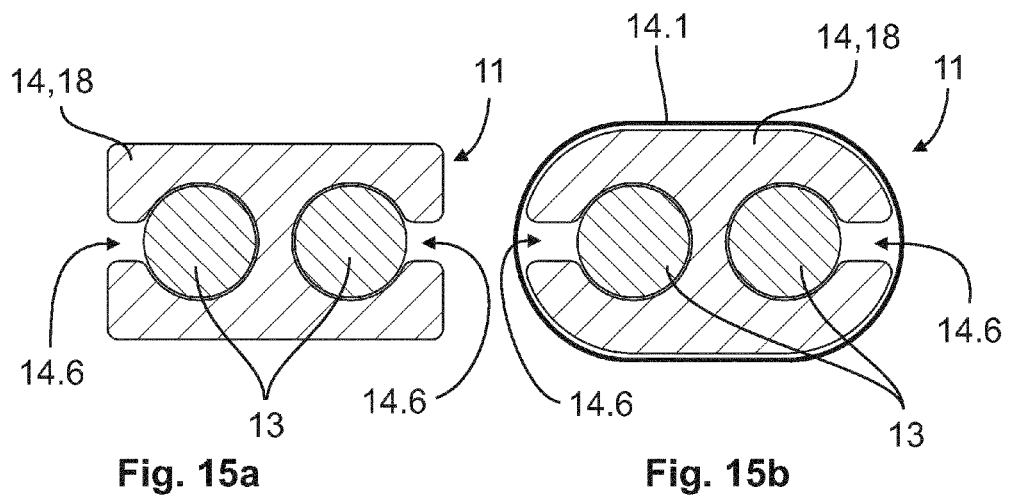
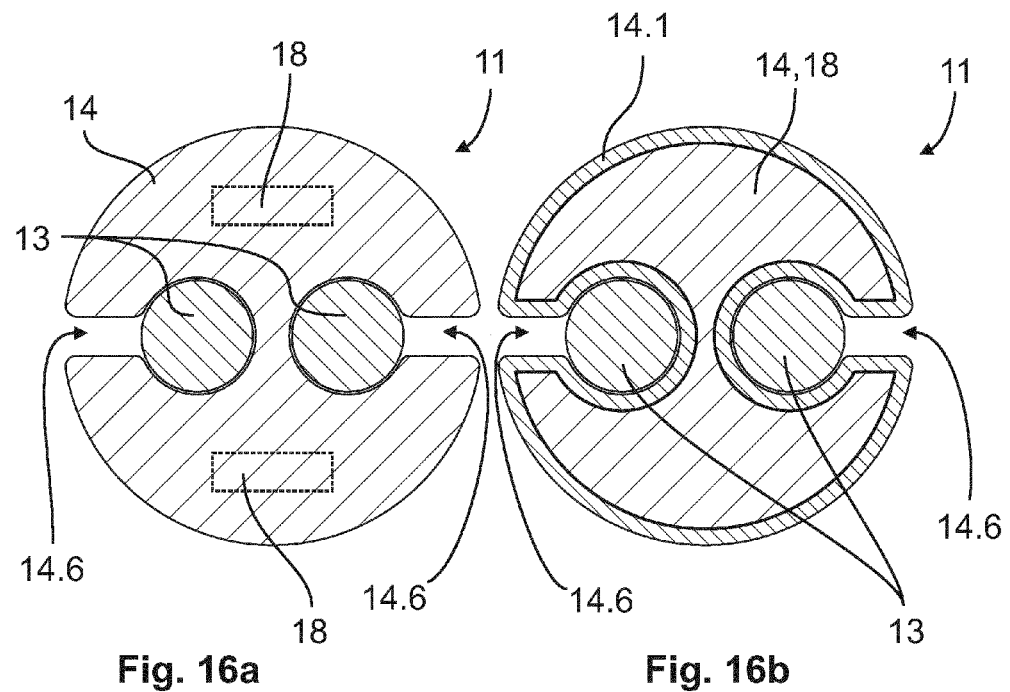

SIMPLIFIED CAPACITIVE SENSOR UNIT

The present invention is related to a sensor unit for actuating an actuating element, particularly a hatch of a vehicle or the like without contact according to the preamble of claim 1. Herein, the sensor unit is equipped with at least one capacitive sensor element, whereby the sensor element comprises a wire which is assembled at the support element. Further, the present invention is related to a security system for (particularly) opening or closing a hatch of a vehicle or the like without contact according to the preamble of claim 23. Further, the invention relates to a method for the production of a sensor unit for an actuation of an actuating element, particularly a hatch of a vehicle or the like without contact, according to the preamble of claim 24.

From the state of the art such sensor units are already known and serve for example for an opening of the hatchback of a vehicle without contact. In document DE 10 2010 049 400 A1 such a sensor unit is disclosed. For this purpose capacitive sensors are used as proximity sensors with the corresponding sensor unit which properly comprise a wide electrode. Electrodes configured in a wide manner thereby comprise the advantage that the sensor field is optimally configured in order to be able to recognize the approach of an object, particularly in form of a leg of a user, via a capacitive alteration of the sensor. Therewith it has turned out as an advantage when the capacitive sensors comprise a certain width in order to improve the measurement result. From document DE 10 2010 038 705 A1 likewise a sensor unit is disclosed which serves for controlling the hatchback of a vehicle without contact. In this document it is likewise explained how a collision avoidance with an object within the area of the hatch can be achieved.

Likewise a sensor unit is known from document DE 10 2010 060 364 A1 for the actuation of a hatchback at a vehicle which comprises two separated capacitive proximity sensors in order to be able to metrologically recognize the movement of a leg, particularly the movement pattern. The sensor unit is in contact with a security system of a vehicle so that by the sensor unit an authentication of an ID transmitter can also be initiated by a user.

The sensors for such sensor units already known from the state of the art therewith comprise a certain width and length in order to reach the optimal measurement range. Therefore normally flat electrically conducting belts or films are used as sensors. Since these are however located or assembled in a critical area of a vehicle, particularly at the inner side of the bumper, which is exposed to heavy contamination, rockfall, waterjets and suchlike, these sensors have to be fit protected from external influences. In praxis it has been shown that not sufficiently protected sensors have been damaged by splashing water and rockfall which leads to the fact that the sensors become inoperative.

It is the object of the present invention to provide a sensor unit and a sensor system, particularly for a security system of a vehicle, which avoids the disadvantages from the state of the art. Particularly it is object of the present invention to obtain a cost efficient and robust sensor unit which is also resistant against external mechanic environmental influences.

According to the invention this object is solved by a sensor unit with the features of the independent claim 1, particularly from the characterizing clause. Likewise, the object is solved by a security system, particularly a (passive or active) keyless entry system for vehicles with the features of the independent claim 21. Likewise, for the solution of the object a method for the production of the sensor unit with the features of claim 22 is intended, particularly from the characterizing clause. In the dependent device and method claims preferred embodiments of the invention are described. Features which are disclosed in connection with the sensor unit according to the invention and or the security system according to the invention thereby also apply for the production method according to the invention and vice versa. Likewise is it possible to produce the sensor unit according to the invention by the method according to the invention from claim 24.

The sensor unit according to the invention for an actuation of an actuating element, particularly a hatch or the like of a vehicle, without contact at least comprises a capacitive sensor element, wherein the sensor element in turn comprises a wire which is assembled at a support element. Hereby it is intended according to the invention that the support element comprises at least one electrically conducting core. This electrically conducting core serves for improving the metrological characteristics of the capacitive sensor element and if necessary expanding the measuring range of the sensor element. For this purpose the electrically conducting core is capacitively coupled to the wire of the support element. Thereby, the wire and the electrically conducting core together build a capacitive sensor element, wherein a necessary width of the sensor element can be achieved. Therefore it is not necessary that the wire itself is directly connected with the electrically conducting core in an electrically conducting manner. Rather, an (electric) isolation between the wire and the electrically conducting core can be intended. By the preferably simple design the sensor unit according to the invention can be produced in a cost efficient manner, since an automated production of the sensor unit according to the invention with the capacitive sensor elements is possible. Likewise the existing capacitive sensor elements are protected particularly well against external mechanical influences so that a permanent operation of the sensor unit particularly in a rough measurement environment, like for example in the mostly external area of the vehicle, is ensured. By a capacitive coupling of the wire to the electrically conducting core the respective capacitive sensor element likewise comprises excellent measurement properties, which in experiments turned out as highly advantageous. Likewise it is possible that the wire can be assembled at the support element particularly protected from external influences. Therewith the support element serves quasi as a housing for the wire. Likewise it is possible that the wire can be assembled with the support element in another housing or cover so that this unit is reliably protected from external influences like for example moisture, salt or suchlike.

The sensor unit according to the invention can at least comprise two or more capacitive sensor elements which are ideally connected to one another via a common plug. Further it is possible that for each sensor element a separated plug is used. Normally the respective plugs are assembled at the vehicle next to each other or in an offset pattern in order to therewith recognize a movement pattern from the user for example by an indicated kick or a passing by. For this purpose the sensor unit according to the invention is electrically connected with a control device via the present plugs. Ideally the wire runs from the single sensor element directly into the plug so that connecting junctions or transition pieces can be avoided. Hereby likewise production costs can be reduced. Likewise therewith a critical weakness with the sensor unit disappears, since the sensor element is configured without contact, meaning that the sensor elements comprise no electrical connecting points, also no covered or sealed contact points. In the already described control device likewise multiple sensor units can converge and be metrologically evaluated. This control device can transmit the determined measurement signals to the vehicle electronic and to the single security systems. Preferably therefore the control device comprises a data bus interface for example in form of a CAN or LIN bus. Hereby the sensor unit according to the invention can be integrated into the whole vehicle electronic in a simple manner.

According to the invention it is possible that the wire proceeds mainly parallel to the longitudinal direction of the support element. Hereby a coiling of the wire at the support element in order to reach a certain width of the measurement area can be avoided. Therewith the wire proceeds mainly linear at the support element and therewith a particularly short wire can be used which can be assembled at the support element in a preferably simple and secure manner.

Further it can be intended according to the invention that the wire is assembled at the support element endlessly wherein particularly both edges of the wire are intended at one edge of the support element particularly protruding. Thereby "endless" means that the wire does not simply end at or in the support element but that only one loop or a center piece of the wire is completely assembled at the support element and both edges of the wire are ideally connected at the said plug. Hereby it is possible that via a simple resistance measurement the functionality of the sensor element or the sensor unit according to the invention can be validated. Further, also a plug recognition is possible with the control device in a simple manner since a resistance measurement directly provides information. Likewise a permanent disruption monitoring of the capacitive sensor element with the continuous wire which is endlessly assembled at the support element is therewith possible in a simple manner. Likewise, the endless assembly comprises the advantage that no additional electrically conducting contact points are intended at the support element, which always constitute a weak point, since these have to be protected from corrosion and mechanical load. A continuous wire therewith comprises the main advantage that it does not comprise such weak points.

Likewise it is possible within the scope of the invention that the wire is mainly assembled in one level at the support element. Hereby it has turned out as an advantage when with the intended level the wire is assembled preferably close and/or parallel to the electrically conducting core, wherein in a whole the capacitive performance of the sensor element is increased. Therefore is it also an advantage when an isolation between the wire and the electrically conducting core comprises a high permittivity and dielectric constant. By the use of the electrical core at or in the support element the measurement area of the capacitive sensor element is significantly improved or increased. In contrast to the measurement area of the pure wire the measurement area of the capacitive sensor element with the electrically conducting support can be considerably increased.

Likewise it is possible with the present invention that a piece of the wire which is directly assembled at the support element comprises a length which is mainly twice as long as the length of the support element. Therewith it becomes apparent that the wire at one edge of the support element is guided back and forth. Thereby it is an advantage when the wire is guided along the whole length of the support element and at the opposing edge a turning of about 180° occurs in order to guide it back from the other edge, the second edge, to the first edge. Hereby the wire is assembled at the support element particularly in a U-form wherein the turning of the wire at the second edge can also occur outside meaning not directly at the support element.

In order to improve the measurement properties of the sensor unit according to the invention the electrically conducting core can be configured extensively. This electrically conducting core can be completely assembled in the support element or also only at the support element. Important however is the capacitive coupling of the wire to the electrically conducting core.

Thus it is described here that it is likewise possible that the electrically conducting core completely forms the support element. Therewith it has to be understood that the electrically conducting core itself constitutes the support element. Hereby it is appropriate when the used wire itself comprises an isolation which galvanically separates the wire from the support element.

Likewise it is possible that the support element is covered or moulded with a protective cover which particularly represents an electric isolation. In this case the support element can likewise completely consist of the electrically conducting core. Naturally also a support element which is of not conducting material and comprises an electrically conducting core can be covered or coated.

Further it is possible within the scope of the present invention that the electrically conducting core is configured flatly. Hereby it is even possible the electrically conducting core is configured film-like. Advantageously it has turned out that the core comprises a thickness of smaller than 5 mm, preferably smaller than 2 mm and particularly preferably smaller than 0.5 mm. Thereby the decreasing thickness of the electrically conducting core comprises the advantage that the whole sensor element is getting more flexible since a mechanical deformation of the electrically conducting core is facilitated with a decreasing thickness.

Further it is possible within the scope of the present invention that the electrically conducting core extents mainly about the complete length and/or width of the support element. Therewith the core does not necessarily need to be completely assembled in the support element but can also terminate at the first and/or second edge of the support element with the support element. Thereby a particularly long and/or wide measurement area of the sensor unit according to the invention can be reached, since the core extents about the complete length and/or the complete width of the support element. Moreover, the production of the support element is thereby facilitated since quasi the support element can be produced as continuous material or piece goods particularly in a (plastic) continuous casting process by embedding a very long, electrically conducting core. For the production of the sensor unit according to the invention then only the thread of the support element has to be cut to a desired length wherein then only the electrically conducting wire is assembled which preferably occurs by clipping.

(X2:) In order to preferably easily configure the reduction of the support element (particularly with piece goods) to the desired length it can be intended that the electrically conducting core and/or the support element comprises corresponding separation areas and/or predetermined breaking points or joints. Thus, the support element particularly produced as piece goods with the electrically conducting core can be brought to the desired length by a simple separation (for example cutting, sawing or turning or tearing). For this purpose the electrically conducting core can comprise the already described separation areas and/or predetermined breaking points. With the support element therefore the already described joints can be provided. Advantageously the separation areas and/or predetermined breaking points of the core geometrically correspond with the joints of the support element.

Since the electrically conducting core is continuously guided at the support it can be previously equipped with the plug so that the complete production of the sensor unit according to invention can be performed particularly simple in a mainly automated manner and with few production steps. Moreover, also individually alterable sensor units can be produced since, like already described, only the support element has to be reduced to the corresponding length and then the correspondingly long wire is assembled to it. Further individual production criteria are therewith not necessary. Therewith a desired customized production is possible.

Further it is possible according to the invention that at the support element a hump is assembled which is particularly assembled in the area of a joint of the support element and/or the separation area or the predetermined breaking point of the core. The previously described hump comprises an accumulation/collection of material from the support element which can be closed with a shortened support element at a joint. Therefore the hump can be used which closes the separation area from the support element in a material locking manner by heating and therewith protects the electrically conducting core optimally against corrosion. Also with an electrically conducting core which consists of corrosion protected material it can make sense to close the separation area from the support element with the material from the hump in a material locking manner in order to avoid that in this area in a possible recess moisture or water accumulates. Particularly moisture and water significantly distort the measurement result of a capacitive sensor. Therewith the described hump serves for closing the joint and particularly a present recess with the separated support element in a material locking manner. Ideally the humps are assembled in the area of the joints of the support element or in the area of the separation areas or predetermined breaking points of the core.

Further it is possible according to the invention that the electrically conducting core of the support element or the support element itself is mainly surrounded by a particularly even protective cover which is also partly referred to as a base plate. This protective cover can at the same time comprise the electrical isolation wherefore it is advantageously made of plastic. Provided that the protective cover represents an electric isolation it is ensured that the wire is galvanically assembled separated from the core of the support element.

Independently from the arrangement of the support element it can be likewise intended that the wire comprises an electric isolation at least in the area of the support element. Advantageously standard wires can be used for the wire which are cost efficiently available and as piece goods. Hereby a wire according to the standard FLRY or FLY can be used. This wire can be a single lead conductor which particularly comprises multiple copper strands. An ideal cross section of the wire amounts approximately 1 mm, however also thinner or thicker cross sections are possible. With the thinner wires however the risk occurs that its mechanical capacity is relatively small and therewith damages can occur with the assembly of the wire at the support element. The thicker wires comprise a cost disadvantage since significantly more copper content is used. Therewith only the cost increase mainly because of an increased consumption of copper, however not the technical performance of the sensor element. Ideally the wire comprises a continuous isolating layer which is passed through until the plug of the sensor unit.

The used sensor elements can preferably be identical in construction according to the sensor unit. Hereby the production costs can be further reduced since the number of pieces per sensor element increases significantly. However it is possible that two or more not structurally identical sensor elements form one sensor unit. Thus, for example the length of the sensor element can vary, which is mainly also predetermined by the length of the support element. Also the width of the respected sensor element of a sensor unit can be designed differently. Hereby, however the production costs cannot be reduced but an increased operational capability of the corresponding sensor unit at the vehicle can be reached.

Moreover it is possible within the scope of the invention that at least one capacitive sensor element of the sensor unit comprises a shielding area by area. Hereby the measurement area of the sensor element can be selectively influenced in order to fade out for example disturbances which are otherwise registered by the sensor and are actually outside the desired measurement area. Thus, the area of the wire between the plug and the support element can be provided with a shielding. The shielding can likewise only be a wire or a metal film or a flat band which comprises another electric potential as the electric (measurement) wire of the capacitive sensor element, preferably the shielding is "grounded" or equipped with a zero potential. Naturally, also two separate shielding wires can be intended at a capacitive sensor element, likewise it is possible that an additional shielding element is used with the sensor unit according to the invention which is assembled for example beneath the two capacitive sensor elements or behind the two capacitive sensor elements.

In order to improve the flexibility of the sensor element it can be intended according to the invention that the electrically conducting core is configured comb-like, particularly double-comb-like. By comb-like it has to be understood that from a central bridge the single tines extent particularly vertically wherein the tines are assembled parallelly to one another at the central bridge. By double comb-like it has to be understood that the tines are assembled on both sides of the central bridge. In order to improve the flexibility of the comb-like core it is intended that all tines are assembled at the same height at the central bridge so that no offset occurs of the tines assembled at both sides to one another. Likewise, further material cost can be saved by this comb-like configuration since between the single tines of the comb-like core spaces arise which are free of material.

In order to configure the sensor elements according to the invention, preferably free from corrosion, it is intended that the electrically conducting core comprises stainless steel, copper, brass and/or conducting polymers. The previously named materials comprise the advantage that they are on the one hand electrically conducting and on the other hand insensitive for corrosion. As far as the support element is produced as piece goods the edges of the electrically conducting core extent unprotected from the support element. Within the scope of the present invention by the term piece goods a long rod-like material (multiple meters long) has to be understood from which the desired length for the support element is produced by cutting. Stainless steel moreover comprises the advantage that it is more cost efficient than brass or copper. Brass or copper moreover comprise good electrical conductivity wherein the measuring ability of the sensor element is improved, likewise it is possible that the electrically conducting core comprises a conducting polymer so that the whole support element is configured highly flexibly. All previously mentioned materials can be configured flatly and comb-like or double comb-like as an electrically conducting core.

As far as the conducting core or the whole support element comprises conducting polymers it can be one of the following materials:
PEDOT:PSS
Polyacetylen
Polyanilin
Polyparaphenylen
Polypyrrol
Polythiophen Such electrically conducting polymers comprise an intrinsic electrical conductivity. Thus, such polymers comprise an extended π-electron system. Only with a doting of the polymers a significant increase of the electrical conductivity is reached. With strong oxidation and reduction means delocalized ionic centers occur within the polymer to which the respective doting means forms the counter ion. Likewise it is possible that with some polymers, particularly elastomers, thermoplastic elastomers or thermoplastics a conductivity is achieved by an admixture of metal powder, soots or graphite. Particularly with rubbery electric conducting polymers the use of the sensor unit according to the invention can be increased in a way that the extreme flexibility of the sensor element is reached. Hereby also the outer contour of the support element can be altered so that the support element comprises for example a circular or rectangular cross section and the wire is assembled within.

Further it is possible within the scope of the invention that fastening means are assembled at the support element particularly in form of clamps through which the wire can be fixed and/or assembled at the support. Advantageously, such an assembly can occur by a form fit in which for example the wire can be clipped and/or hooked by an intended fastening means. With this variation it is additionally an advantage when the already described protective cover or base plate of the support element is configured in one piece and/or material uniformly with the fastening means. Advantageously, herein the electrically conducting core is covered by a plastic injection moulded part at which the fastening means are directly moulded. Like already described such a support element can be produced as a strand-injection-moulding-material in form of piece goods. From the present fastening means the shortened support element can be equipped with the necessary wire so that the support element forms the essential components of the capacitive sensor element with the electrically conducting core and the wire. Via the fastening means the wire is assembled completely or partly covered at the support element.

The previously described fastening means can be assembled singly or partly at the support element. Likewise it is possible that the fastening means are continuously assembled over the length of the support element. Therewith the wire can be protectively assembled from one edge to the other edge of the support element continuously over the fastening means at the support element. Only at the edge of the support element the wire is redirected and is protectively laid back via a second fastening means which is in turn assembled at the support element continuously from the beginning to the end. Therewith, the two continuous fastening means are assembled particularly in parallel to one another at the support element. In order to improve the metrological properties of the sensor unit. Both parallel fastening means are assembled at the support element as far as possible on the outer edge (according over the width of the support element), wherein the measurement area can be widened. The fastening means itself is configured mainly hook-like, wherein a bridge or a neck extends from an even area of the protective cover or base plate of the support element at which then the hook of the fastening means or a mushroom head-like head is associated. This hook or mushroom head-like head is deformed in a way that it keeps the wire at the support element particularly in a form-fitting manner. Due to the flexibility of the fastening means the wire can be clipped to the support element by the fastening means. Herein, the gap between the edge of the hook or mushroom head-like head of the fastening means to the support element can be configured smaller than the maximum thickness of the wire. In this preferred case the gap is quasi non-existent so that the fastening means with its open hook is in turn in contact with the already described base plate or even protective cover, however it is not connected to it. The existing gap between the open end of the fastening means and the base plate of the support element can be assembled towards the outside or the inside according to the width of the support element. As far as the hook-like fastening means is open towards the outside the mounting of the wire is particularly simple. If however, the opening of the hook-like fastening element is to the inside, meaning directly towards the center access of the support element, thus the wire is assembled ideally protected at the support element. Optimally, it is possible that at the fastening means additional arresting plates are assembled by which it is ensured that the wire can no longer reach out of the fastening means after the mounting at the support element. Likewise it is possible that the opening of the hook-like fastening means is closed in a material locking manner after the mounting of the wire. This can for example occur by a casting compound or silicon or welding. Therewith it is ensured that the wire is assembled at the support element in a way that it is completely protected covered by the fastening means.

In order to particularly assemble the redirected wire in a way that it is likewise protected at the edge of the support element a cap can be intended which is stuck over one edge of the support element and, if necessary, securely assembles the wire underneath. The cap can for example be clipped, glued or welded to a corresponding edge of the support element. In case when the support element is generated as piece goods or mass product it is an advantage when at least the separated edge of the support element is covered with a cap. Thereby the cap can also serve for guiding the wire particularly when the cap is not closing the edge of the support element by which the wire is redirected. Thus, a strain relief for the wire can be intended at the cap in order to mechanically fix the wire with both edges at the cap or the support element. Therewith in general a particularly cost efficient production of the sensor element according to the invention can occur. Additionally, the cap can protect the separated edge from the support element particularly the electrically conducting core from the support element from environmental influences and corrosion appearances. At the same time the cap can serve for the fastening of the sensor element at the vehicle by the fact that the cap has corresponding fasting means. As far however the complete support element with the assembled wire is covered again for example by a tube or is assembled in a housing the additional cap can be avoided.

Like previously described the fastening means at the support element serve for guiding and supporting the wire at the support element. Therefore the fastening means can comprise a neck and a mushroom head-like edge in order to be configured hook-like. It is an advantage when the wire within the guidance is longitudinally adjustable by the fastening means at the support element. Hereby the flexibility of the whole sensor element can be additionally improved, wherein mechanical tension and/or compression stress within the wire are avoided.

Within the scope of the invention it is particularly an advantage when the sensor element with its support element and the wire are all in all configured flexibly particularly in longitudinal direction. Hereby the support element can be adjusted for example to the different inner contours of the bumper of the vehicle in a simple manner. Therewith the support element is adjusted to the respective form of the bumper or the door sill or suchlike during mounting. Likewise therewith also the sensor element can be guided via edges and angles at the vehicle wherein for example also the measurement area can be bent about 90 degrees if for example a measurement from the rear side area to the rear part of the vehicle should occur. In order to achieve the necessary flexibility. The support element itself can be assembled from a flexible raw material. Thereby a special prefabricated form of the support element can be avoided whereby additional costs can be saved. The support element can for this purpose comprise a base plate from which particularly the fastening means extent for fixing the wire.

Further it is possible according to the invention that at least one lid element is intended at the support element wherein the support element with the wire can be partly covered. Likewise the lid element can completely cover the support element so that the wire is securely assembled underneath the lid element and is protected from direct mechanical influences. Preferably, this lid element can be connected with the support element particularly the protective cover or the base plate in a material locking manner or via a hinge or suchlike. After mounting of the wire the lid element can be closed so that it serves as an additional protection element for the wire assembled underneath. Ideally the lid element is jointly connected at the support element at least on one side via a film hinge particularly with the base plate. Via a clip connection then the lid element can be closed with the support element at another side of the lid element. Therewith the corresponding support element itself forms a housing in which the coiled wire is securely assembled.

Further it is possible within the scope of the invention that the whole support element can be assembled within the housing or a cover for example in form of a tube in order to be protected from outer influences.

Likewise it is possible that the support element is configured as an injection moulding element from a stable plastic. Hereby at least one joint with at least one bond bridge can be assembled over the length of the support element in order to achieve a flexibility of the support element particularly in longitudinal direction. Naturally also multiple joints can be assembled over the length of the support element whereby the flexibility is further improved. By the use of the joints it is possible to produce an injection moulding element from only one material which is on the one hand stable enough to guide and hold the coiled wire and on the other hand is so flexible that the support element or sensor element can be adapted to a predefined form for example by the inner contour with a bumper of a vehicle. Ideally only one center bridge of the electrically conducting core is assembled in the area of the joint.

In order to assemble the single sensor elements in the sensor unit particularly simply and securely at the vehicle it can be intended that at the support element support means are assembled with which the sensor can be fixed at the vehicle. Hereby the described support means can enable an assembly at the vehicle in a material locking and/or force fitting and/or form-fitting manner. Ideally the support means are intended or injected directly at the base plate or the lid element. As support means even plates can be used with which for example the sensor element can be glued or welded to the vehicle. Likewise cone-like or arrow-like or projection-like catch means can be intended as support means with which the support element can be assembled at the vehicle by clipsing. According to the configuration of the support means an irreversible or reversible fixing of the sensor element at the vehicle can occur.

Likewise it is possible that the support element can be fixed at the vehicle via external fastening means like for example braces or clamps or screws or rivets. Thus, for example a housing-like brace can serve for fixing the support element at the vehicle which at the same time configures a housing for the support element, partly or in a whole. Likewise combined support means are possible within the scope of the invention.

Further, the present invention is also directed to a security system for opening and/or closing a flap of a vehicle or suchlike without contact according to claim 23. Hereby, at least one sensor unit according to the invention (meaning according to claims 1-20) is used. Like already described the single sensor units according to the invention are connected with a security system of the vehicle via one or multiple control devices. Thereby the control devices can also be integrated in the security system.

Likewise, the present invention is directed to a method for the production of a sensor unit according to the preamble of claim 24. Hereby it is intended according to the invention that a wire is continuously fixed at the support element. Prior to fixing the wire at the support element however the support element itself has to be produced. This can be produced in a preferred manner as a plastic injection moulding part in form of piece goods. Thereby, the electrically conducting core is directly embedded in the support element or the support element itself builds the core as far as it comprises a technically conducting polymer. The preferably intended fastening means for fastening the support element can thereby be produced at the same time as well at the other previously described elements of the support element or the elements which can be connected with the support element in a material locking manner like for example the lid element. After the support element is produced with its core as piece goods it must be shortened to the desired length which can preferably occur by (laser-) cutting, breaking, turning, sawing. Now the support element already comprises the correct length. At this support element the wire is fixed by clipsing it to the support element with the help of the fastening means or by pressing in or retracting into the fastening means. The wire is at least partly or completely covered by the fastening means at the support element. Like previously described it is possible that the opening gap of the hook-like fastening means is closed in a material locking manner for example by a protective cover or a shrinking tube. As far as humps are available at the support element therewith a joint of one edge of the support element can be closed before or after the mounting of the wire. Additionally at least one or two edges of the support element can be equipped with a cap. The completed support element can now be mounted as far as the wire is already intended with the necessary plug.

Figures 2A, 2B:
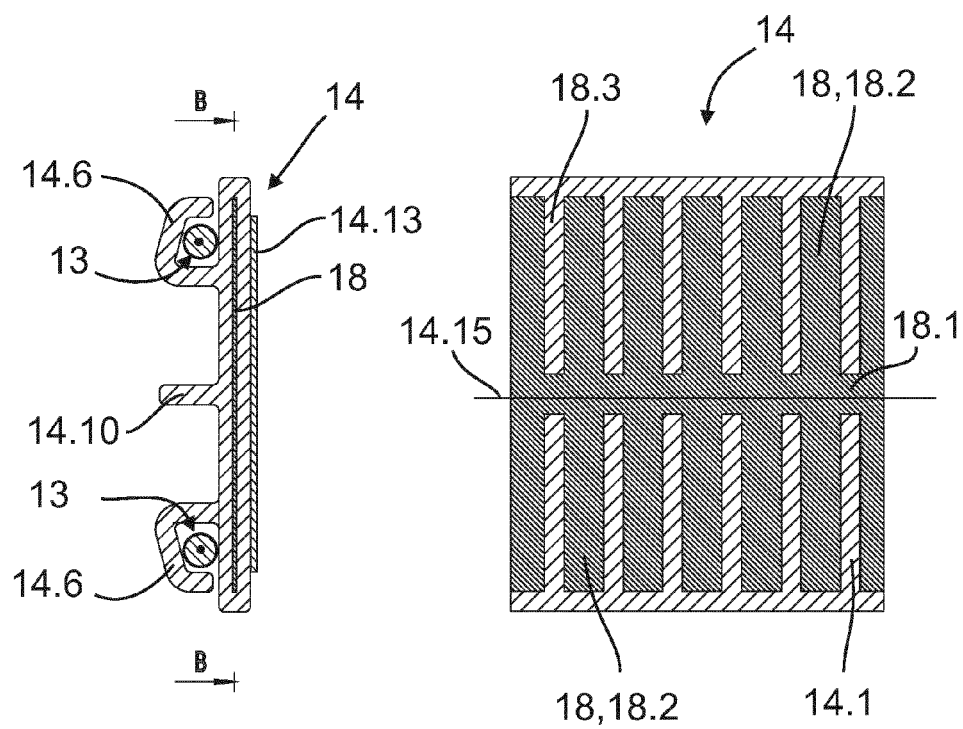
Figure 5:
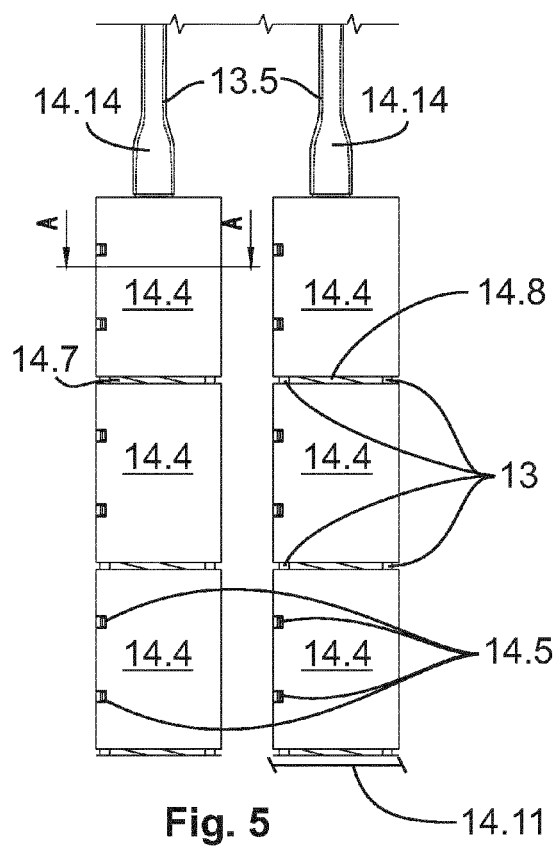
Figure 5A:
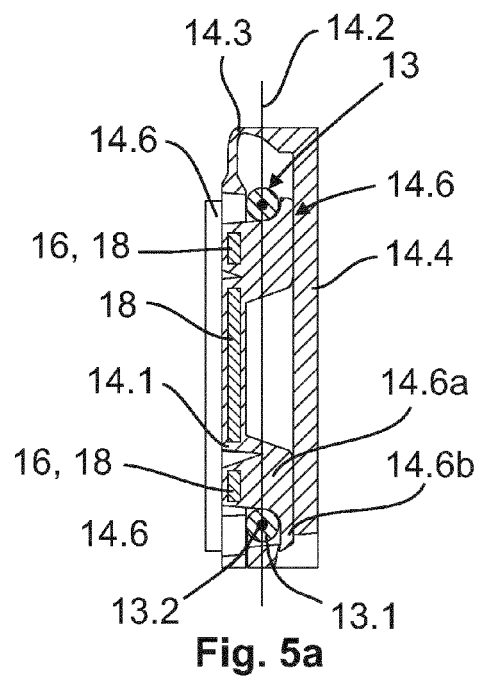
Figure 6:
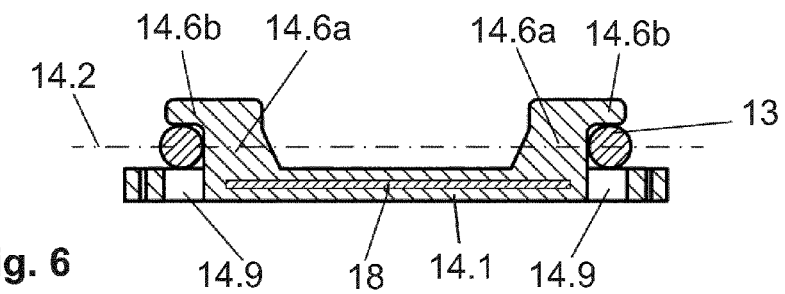
Figure 7:
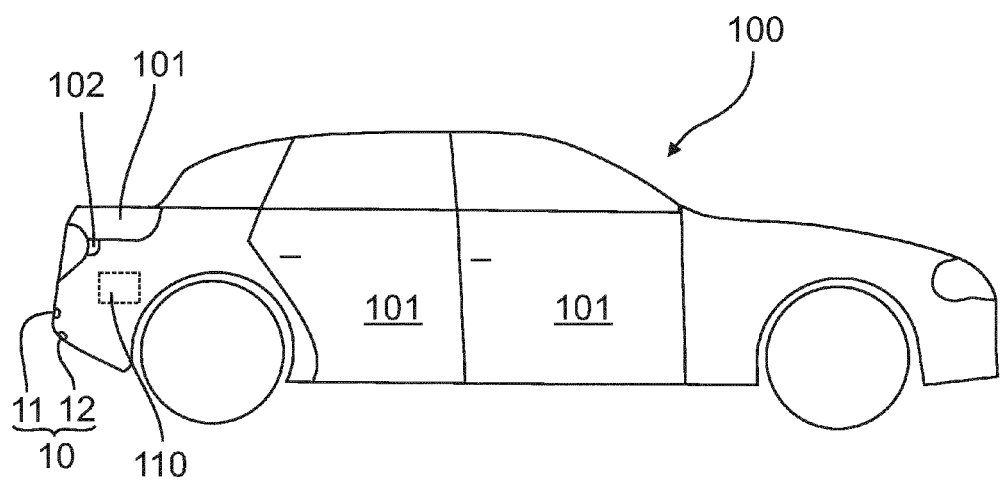
Figure 8A:
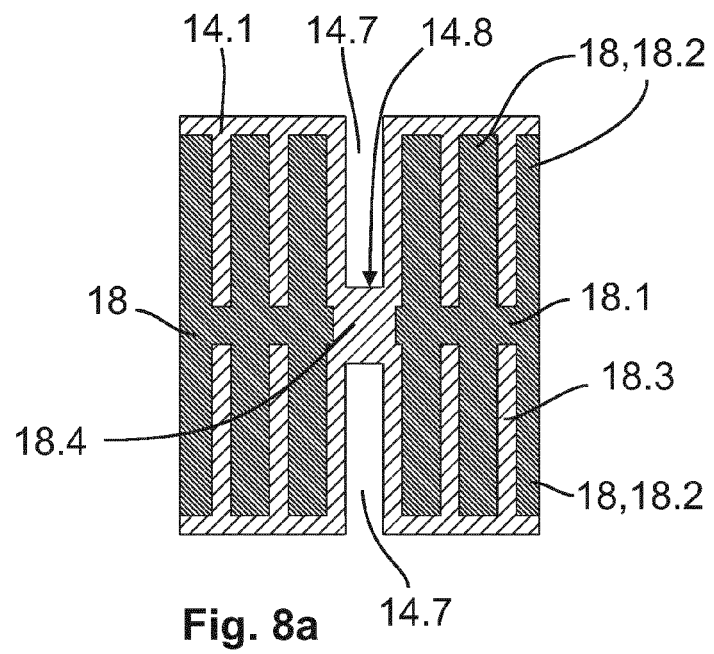
Figure 8B:
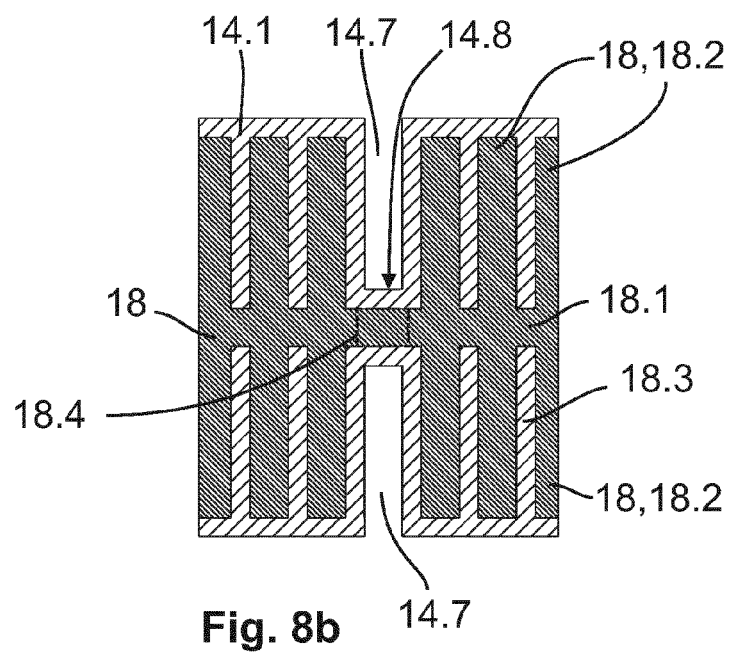
Figure 9:
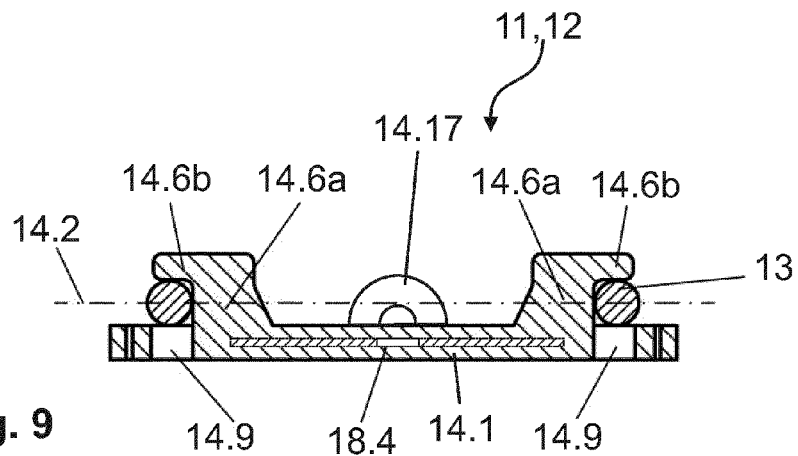
Figures 10A, 10B:
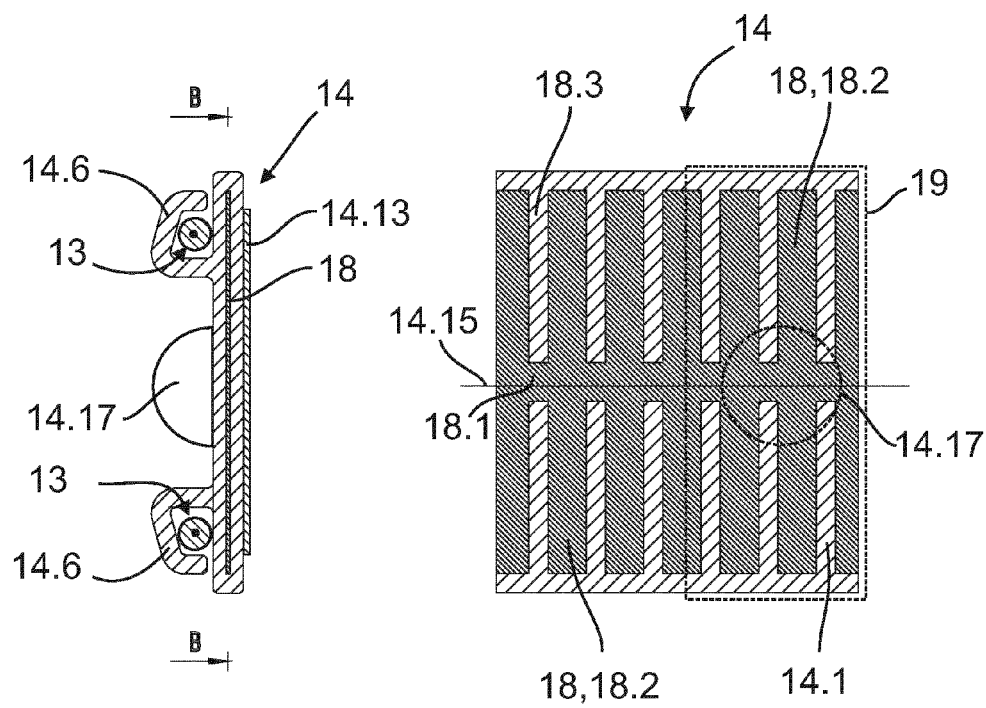
Figure 11:
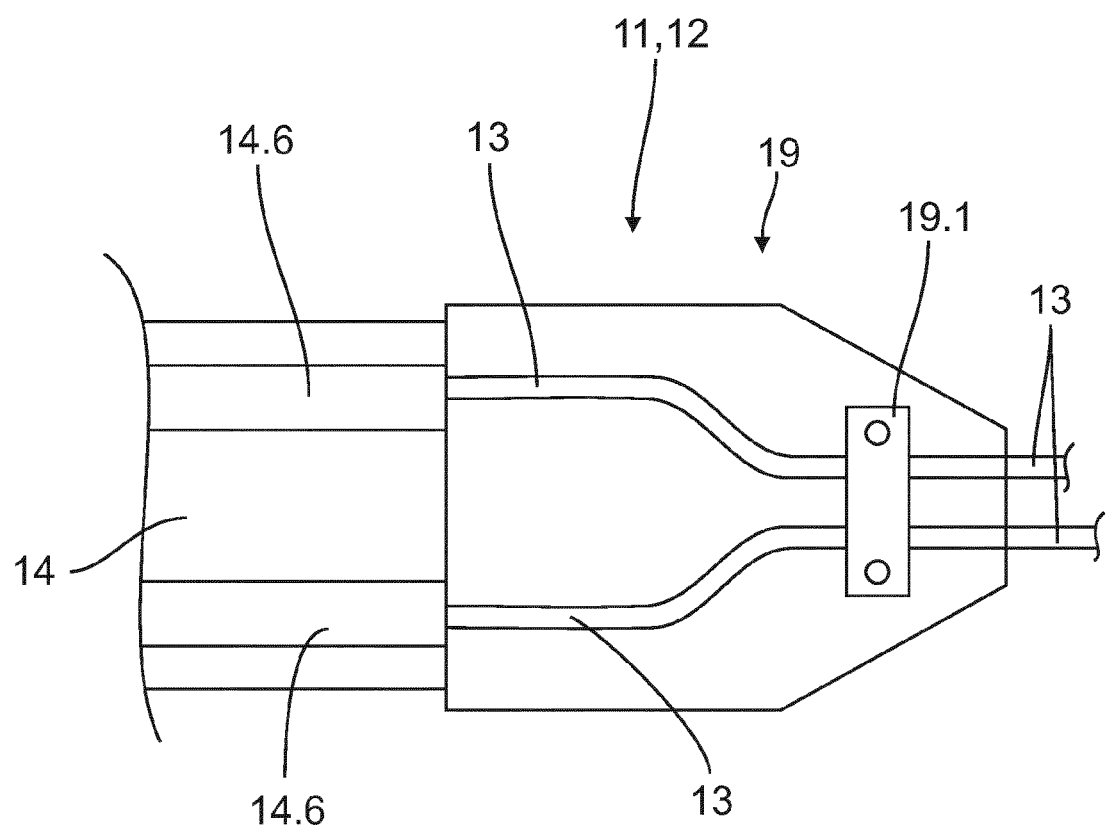

According to the invention the features of the description and the claims and the device according to the invention and the method according to the invention can be essential for the invention single for themselves or in different combinations. Further measures improving the invention are subsequently described in detail together with the description of the preferred embodiments of the invention according to the figures. It is shown:

FIG. 1 a top view of a sensor unit according to the invention with two capacitive sensor elements, FIG. 1*a* a section A-A through the sensor unit according to the invention from FIG. 1 in the area of the plug, FIG. 1*b* a section B-B through the sensor element of the sensor unit according to the invention from FIG. 1, FIG. 2 a schematic top view to a section of the sensor element of the sensor unit according to the invention, FIG. 2*a* a section A-A through the sensor element from the sensor unit according to the invention from FIG. 2, FIG. 2*b* a section B-B from FIG. 2*a* in the area of the electrically conducting core from the sensor element of the sensor unit according to the invention from FIGS. 2*a* and 2, FIG. 3 a comparable section A-A like in FIG. 2*a* through an optional sensor element in the sensor device according to the invention like in FIG. 2, FIG. 4*a* a section A-A through an optional sensor element comparable to FIGS. 2*a* and 3 in a sensor unit according to the invention, FIG. 4*b* a section B-B through the sensor element of the sensor unit according to the invention from FIG. 4*a*, FIG. 5 a partial top view of the sensor unit according to the invention with two sensor elements, FIG. 5*a* a section A-A through a sensor element of the sensor unit according to the invention from FIG. 5, FIG. 6 a section A-A through a further optionally configured sensor element of a sensor unit according to the invention, FIG. 7 a lateral view of a vehicle with a security system according to the invention and at least one sensor unit according to the invention, FIG. 8*a* a comparable section B-B comparable to FIG. 1*b* through a further sensor element wherein the core comprises a separation area, FIG. 8*b* a comparable section B-B from FIG. 8*a* through a further sensor element wherein however the core comprises a predetermined breaking point, FIG. 9 a section A-A through an optional configured sensor element with a hump for closing the joint of the support element FIG. 10*a* a section A-A through an optionally configured sensor element with a hump as a collection of material, FIG. 10*b* a section B-B through a sensor element from FIG. 10*a* with an indicated cap, FIG. 11 a schematic top view on an initial edge of the support element with a cap with strain relief, FIGS. 12*a*-16*b* sections AA through optionally configured sensor elements with different support elements with diverse cross sections.

In the figures identical reference signs are used for the same technical features also for different embodiments wherein a combination of features for the embodiments is illustrated.

In FIG. 1 the sensor unit 10 according to the invention is shown in a first embodiment in a top view. Hereby the sensor unit 10 according to the invention can be completely recognized with its two sensor elements 11, 12. Like already described it is further possible that the sensor unit 10 comprises further sensor elements 11, 12, identical in construction or different in construction. In or at each sensor element 11, 12 a continuous wire 13 is assembled which has its beginning and its end in the plug 17. Therewith, the corresponding wire 13 proceeds continuously at the support element 14 from the sensor element 11 or 12 and mainly in parallel to the longitudinal direction 15. The embodiment from the FIGS. 1, 1*a* and 1*b* provides a preferred version since hereby the used support element 15 more or less completely protects the present wire 13 by the intended fastening means 14.6.

Like it can be further recognized in FIG. 1 support means 14.13 are assembled laterally at the support elements 14 of both sensor elements 11, 12 which are configured rectangularly and are spread sectionally over the length of the respective support element 14. These support means 14.13 can be equipped with adhesive tapes in order to therewith assemble, particularly glue, the sensor unit 10 according to the invention at the vehicle 100. Likewise the support means 14.13 can serve for fastening the sensor unit 10 in a form and/or force fitting manner to the vehicle 100 particularly at an inner side of the bumper or the side sills.

Like it can be further recognized from FIG. 1 the wire 13 proceeds from each sensor element 11, 12 from the plug 17 to the respective support element 14 and is there assembled parallely to the longitudinal axis 14.15 at the support element 14 and proceeds from a first edge of the support element 14 (proximity of the plug 17) to a second edge of the support element 14 (see reference sign 14.15 of the second edge of the support element 14). At the second edge the wire 13 performs a 180° turning point in total and proceeds again parallel to the longitudinal axis 14.15 from the second edge again to the first edge of the support element in order to again end in the plug 17. In the area of the support element 14 the wire 13 proceeds mainly parallely and is held by the fastening means 14.6 at the support element 14 which can be recognized in detail in FIG. 1*b*. This continuous assembly of the wire 13 at the support element 14 comprises the advantages already described in detail. Additionally, the wire 13 can comprise a shield 13.5 (see FIG. 5) between the plug 17 and the support element 14.

In FIG. 1*b* a section B-B through the first sensor element 11 of the sensor unit 10 according to the invention from FIG. 1 is shown. Like it can be recognized the wire 13 is kept at the support element 14 by each fastening means 14.6 in the outer area of the support element 14. The support element 14 comprises a base plate 14.1 which serves as a protective cover 14.1 for the electrically conducting core 18. The base plate 14.1 or the protective cover 14.1 serves also as an electric isolation for the electrically conducting core 18 which in this case is coupled to the wire 13 only capacitively. The wire 13 is fixed to the support element 14 via the two fastening means 14.6 in a form fitting and if necessary force fitting manner. Like it can be recognized from FIG. 1*b* the two fastening means 16.4 are assembled only at the edge of the support element 14. Only at the edge means that these quasi use the whole width 14.11 of the support element 14 and therewith are spaced apart as far as possible from the longitudinal axis 14.15. The fastening means 14.6 are themselves configured hook-like and comprise a bridge 14.6*a* to which then a hook 14.6*b* is connected towards the open edge. The open edge of the fastening means 14.6 comprises only a small gap to the base plate 14.1. In the present case from FIG. 1*b* the two fastening means 14.6 are open towards the outside. Likewise it is possible that the corresponding gap points from the fastening means 14.6 towards the inside meaning towards the longitudinal axis 14.15. In the middle area of the support element (in the area of the longitudinal axis 14.15) a rib 14.10 is assembled which extents more or less vertically from the base plate 14.1 and is configured uniformly and/or material uniformly with the base plate 14.1. This rib 14.10 can serve for a better handling of the support element 14 in order to keep or be able to press the support element 14 to the desired area of the vehicle 100 for example with the fastening of the sensor unit 10.

Like it can be further recognized from FIG. 1*b* the electrically conducting core 18 comprises circa the same width as the width 14.11 from the support element 14. Only on both edge sides however the electrically conducting core 18 is covered from the support element 14. On the opposing side of the extending rib 14.10 flat support means 14.13 are assembled at the base plate 14.1 which can for example consist from double-sided adhesive tape. Likewise it can be recognized that the wire 13 comprises an isolation 13.1 which surrounds a bore 13.2. The bore 13.2 is the actually electrically conducting element of the wire 13. With the bore 13.2 it can be a multi-wired bore or a single-wired bore. It is clear from FIG. 1*b* that the bore 13.2 comprises no electrically conducting connection to the electrically conducting core 18. Therewith it is clear that the wire 13 is only capacitively coupled at the electrically conducting core 18. Like it can be recognized from FIG. 1*b* the whole sensor element 11, 12 is configured flatly and therewith comprises a relatively small construction height 14.16.

From FIG. 1*a* the section A-A from FIG. 1 is shown in the area of the plug 17. Thereby the two lower contacts 17.1 serve for the electric contact of the first sensor element 11. For this purpose the wire 13 leads from the first sensor element 11 with its first edge 13.3 away from the plug 17 and ends in its second edge 13.4 again by the plug 17. In the center of the plug 17 the contact 17.3 for example for a shield 13.5 from the wire 13 can serve for one or both sensor elements 11, 12. The two upper contacts 17.2 of the plug 17 are intended for the second sensor element 12. The plug 17 itself comprises a labyrinth seal so that a watertight connection between the plug 17 and the corresponding connective socket is possible within the vehicle 100. Additionally a plug 17 is configured with a snap protection so that the plug 17 form fittingly locks with the connective socket and cannot be shaken off by a vibration.

In FIG. 2 a section-wise top view of a part of the sensor unit 10 according to the invention is shown or accurately of the first sensor element 11. Thereby the section A-A is indicated which is shown in detail in FIG. 2*a*. Like it can be recognized in FIG. 2 both fastening means 14.6 proceed over the complete length 14.12 of the sensor element 11 or the corresponding support element 14.

In FIG. 2*a* a comparable section in shown like in FIG. 1*b*. Hereby again an electrically conducting core 18 is surrounded by a protective cover 14.1 of the support element 14 which is configured as a base plate 14.1. Assembled thereupon are the two fastening means 14.6 which hold the wire 13 in a form fitting manner at the support element 14. Likewise in this case the two fastening means 14.6 are configured hook-like and extend from the base plate 14.1 in order to coatingly receive the wire 13. In FIG. 2*a* also a section B-B is indicated which is shown in detail in FIG. 2*b*.

Like it can be recognized in the section-wise FIG. 2*b* the electrically conducting core 18 is configured comb-like wherein here a double comb-like form is used. Thereby the electrically conducting core 18 comprises a central bridge 18.1 which is assembled approximately in the area of the longitudinal axis 14.15. Starting from this central bridge 18.1 single tines 18.2 extend and they extend on both sides wherein between the tines 18.2 gaps 18.3 are intended respectively. In the present case the tines 18.2 on both sides from the central bridge 18.1 are assembled at the same height respectively so that no offset between the tines 18.2 occurs. Hereby the flexibility of the whole support element 14 is improved in direction of the longitudinal axis 14.15. Therewith the sensor element 11, 12 can be adjusted particularly well to a predefined form at the vehicle 100. In FIG. 2*b* it is shown that the tines 18.2 are wider than the corresponding gaps 18.3 between the tines 18.2. However the width ratio can also be vice versa so that the tines 18.2 are configured significantly smaller than the corresponding gaps 18.3 between the tines 18.2. Therewith further material of the electrically conducting core 18 can be saved and the flexibility of the support element 14 can be improved.

In FIG. 3 a comparable cross section A-A from FIG. 2 is shown by a further sensor unit 10 according to the invention wherein the support element 14 is shown without wire 13. The support element 14 is mainly differentiated by the used support means 14.13. This is generated in one piece and materially uniformly with the base plate 14.1 from the support element 14 and comprises an arrow head-like tip with which the support element can be assembled at the vehicle 100 with a counter support means in a form and/or force fitting manner. Therefor it only needs to be pushed into the counter support means for which again the support rib 14.10 can serve. By the occurring contact pressure the support element 14 is locked or clipped automatically with the resilient projections of the counter support means which interact with the arrow-like tip of the support means 14.13 in a form-fitting manner. From FIG. 3 likewise the two fastening means 14.6 are obvious. These fastening means 14.6 are likewise configured hook-like wherein initially a bridge 14.6*a* protrudes from the base plate 14.1 particularly vertically. At this bridge or neck 14.6*a* a hook 14.6*b* or mushroom head-like head of the fastening means 14.6 connects. These two fastening means 14.6 are present over the complete length 14.12 of the support element 14. Likewise the two fastening means 14.6 make use of almost the complete width 14.11 of the support element in order to achieve a good capacitive coupling of the wire 13 with the electrically conducting core 18 from the support element 14. The electrically conducting core 18 can be configured as an electrically conducting film or thin metal sheet. The preferred materials of the electrically conducting core 18 are already described previously.

In FIG. 3 the arrow-like support means 14.13 can be configured continuously meaning over the whole length 14.12 of the support element 14 but also only sectionally or punctiformly. Thus a punctiformly configured support means 14.13 can be assembled at the base plate 14.1 of the support element 14 respectively after a certain distance in order to assemble these with the vehicle 100.

In FIG. 4*a* a further cross section A-A is shown comparable to the FIGS. 2*a* and 3. This support element 14 mainly differentiates in its configuration of the support means 14.13. Hereby a quasi U-like configured support means 14.13 is used which is again assembled on the opposing side of the base plate 14.1 of the longitudinal rib 14.10 in order to assemble the support element 14. Thereby barb-like catch means are assembled at the parallel legs of the U-like configured support means 14.13 in order to therewith lock the support element 14 with the vehicle 100 or the corresponding counter support means in a form and/or force fitting manner. In addition to the shown support means 14.13 from FIGS. 3 and 4*a* also adhesive tapes can be assembled at the same side of the support means 14.13 and therewith can assemble the support element in a material locking manner. The section B-B through the FIG. 4*a* is partially shown in FIG. 4*b*. In FIG. 4*b* it can be recognized that a double comb-like electric conducting core 18 is assembled in a plane protective cover 14.1 of the support element 14. Hereby the comb structure of the electrically conducting core 18 however comprises greater gaps 18.3 which serve as joints 14.7 for the support element 14. In order to however continuously configure the support element 14 the center bridge 18.1 of the electrically conducting core 18 serves among others as a bond bridge 14.8 in the area of the joint 14.7. Like it can be recognized in FIG. 1b the central bridge 18.1 is likewise covered by the protective cover or the base plate 14.1 of the support element 14 in the area of the bond bridge 14.8. Herewith a high flexibility of the support element 14 can be reached without having an influence on the capacitive measurement probability of the sensor element 11, 12.

In FIG. 5 a detailed magnification of an optionally configured sensor unit 10 according to the invention is shown from FIG. 1. Hereby basically lid elements 14.4 for the support element 14 are used. Thereby the first three lid elements 14.4 of each support element 14 of both sensor elements 11, 12 are shown. Like it can be recognized in the magnification the single sections of the support element 14 with the respective lid elements 14.4 are separated by joints 14.7 wherein the single areas of the support element 14 are connected to one another via bond bridges 14.8 in material locking manner (see also FIG. 4b). These bond bridges 14.8 proceed diagonally toward the joint 14.7 in the present area and connect the single sections of the sensor elements 11, 12. Further, it can be recognized in FIG. 5 that at the first edge of the support element 14 a respective bend protection 14.14 for both wires 13 of the sensor elements 11, 12 is assembled. Within the bend protection 14.14 a respective shield 13.5 can proceed like indicated by the dotted line. This shield has the object to avoid electromagnetic disturbances which can cause a negative measurement result. In FIG. 5 the single lid elements 14.4 on the support element 14 are closed so that the wire lying underneath is protected. The assembly of the wire 13 occurs again using a fastening means 14.6 which in this case can only be configured punctiformly or sectionally (see for example FIG. 6).

In FIG. 5a a cross section A-A through the first sensor element 11 or 12 is shown. It is particularly pointed out that the electrically conducting core 18 consists of single areas which are assembled in the base plate 14.1. The single sections can be connected to one another in an electrically conducting manner and build the complete core 18. It is further possible that especially in view of FIG. 5a the upper and lower sections are configured as shield elements 16 in order to adjust the measurement field of the capacitive sensors. Therewith in this case only the center sections configure the electrically conducting core 18. It can be further recognized from FIG. 5a that the lid element 14.14 is connected to the remaining support element 14 via a hinge 14.3. This hinge is in the present case configured as a film hinge. In order that the lid element 14.4 closes the support element 14 additional catch means 14.5 are intended so that the lid element 14.4 is kept in the closing position at the support element 14 by the catch means 14.5 in a form fitting manner.

Like it can be recognized in FIG. 5a the support element 14 likewise comprises a base plate 14.1 at which single fastening means 14.6 are assembled in order to retain the wire 13. These fastening means 14.6 are connected to the base plate 14.1 in a material locking manner and comprise a neck 14.6a which merges into a mushroom head-like or cap-like edge 14.6b. With this edge 14.6b the wire 13 is kept down at the fastening means 14.6 so that it is assembled more or less in one level 14.2 which comprises a constant parallel space towards the electrically conducting core 18.

Ideally the present sensor unit 10 is assembled at the vehicle in a way that the mechanical influences from the rear do not affect the support element 14 but from the front to the lid element 14.4. Therewith the function essential wire 13 through which the measurement function of the sensor unit 10 is ensured is protectively assembled within the support element 14.

In FIG. 6 the cross section (comparable to section A-A from FIG. 2) is shown with a further support element 14. Hereby likewise the two fastening means 14.6 assembled at the lateral edges can be recognized which serve for the assembly of the wire 13. Likewise these two fastening means 14.6 comprise a neck 14.6a which is connected to the base plate 14.1 in a material locking manner. The open edge of the fastening means 14.6 likewise ends mushroom head-like or cap-like in the edge 14.6b. In this sectional representation also recesses 14.9 can be recognized which have a production technology-wise advantage.

A main difference between the embodiments from FIGS. 1-4 and the present embodiment from FIGS. 5 and 6 can be seen in the fact that the wire 13 is only abutting to the fastening means 14.6 of the support element 14 and is not clipsed or clamped. By the additional lid element 14.4 or the additional tube in which the support element 14 can be assembled the wire 13 can however not leave its position from the support element 14.

In FIG. 7 a vehicle 100 is shown with a security system 110 according to the invention and a sensor unit 10 according to the invention and the exemplary sensor elements 11 and 12. In order to open the hatchback 101 without contact an actuating element 102 in form of an electro mechanic lock is intended which can be controlled by the sensor unit 10 without contact. As far as the correct control signal is recognized by both sensor elements 11 and 12 or is determined by the corresponding control device the actuating element 102 can be controlled.

In FIG. 8a a section B-B through another sensor element 11, 12 is shown. Therewith this sensor element 11 is configured similarly to the sensor element 11 from FIG. 4b. However the conducting core 18 is interrupted on the longitudinal side and comprises a separation area 18.4 in the support element 14. Like it can be recognized in FIG. 8a this separation area 18.4 is in the area of the joint 14.7 of the support element 14. In case the support element 14 is generated with an integrated core 18 as piece good or mass produced good a simple separation of the support element 14 is possible at the separation area 18.4 or the joint 14.7. With this configuration of the sensor element 11 it is further an advantage that the joint does not need to be protected any further since the core 18 remains in the area of the separation area 18.4 in the support element 14 in a corrosion protected manner.

In the further FIG. 8b a further section B-B through a comparable sensor element 11, 12 from FIGS. 4b and 8a is shown. However, here the separation area 18.4 of the core 18 is replaced by two predetermined breaking points 18.4. These two predetermined breaking points 18.4 can consist of a perforation or a constriction in the core 18. By the predetermined breaking point 18.4 from the core 18 which are advantageously within the area of the joint 14.7 of the support element 14 a simple separation of the support element 14 becomes possible at this position. With the two shown embodiments of the sensor elements 11, 12 in FIG. 8b it is an advantage that the electrically conducting core 18 is continuously, galvanically connected over the longitudinal extension.

In FIG. 9 a section A-A through a comparable sensor element 11 from FIG. 6 is shown. Hereby a hump 14.17 is assembled at the surface of the support element 14 particularly from the base plate 14.1. This hump 14.17 serves as a collection of material in order to be able to close the joint of the support element 14 after separation in a material locking manner. Hereby, the closing can occur by heat development, by melting the hump 14.17 and applying the hot material to the separation area.

In FIG. 10*a* likewise a section A-A through a further sensor element 11, comparable to the sensor element 11 from FIG. 2, is shown. Likewise, the previously described hump 14.17 is used. In the further FIG. 10*b* a section B-B through the sensor element 11 from FIG. 10*a* is shown. Thereby, the hump 14.7 is indicated as dashed which is assembled above the base plate 14.1 at the support element 14. Likewise a cap 19 is illustrated as dashed which for example covers a separated edge of the support element 14 and additionally protects the separation area of the support element 14 against external influences.

In FIG. 11 a top view of the beginning of the support element 14 is shown wherein the corresponding edge of the support element 14 is closed with a cap 19. This cap 19 serves at the same time as an acceptance and assembly of the wire 13 and comprises a strain relief 19.1. Therewith, the cap 19 protects the edge of the support element 14 not only against outer environmental influences but at the same time protects the wire 13 against mechanical stress at this position. The cap 19 can be clipped, welded or glued to the support element 14. Likewise the cap 19 can serve for the secure acceptance of the redirected wire 13 at the other edge of the support element 14.

In the following FIGS. 12*a* to 16*b* diverse sections A-A through further variants of the sensor 11, 12 according to the invention are shown. In the FIGS. 12*a* to 14*a* the wire 13 is arranged through the self-contained cross section of the support element 14 respectively. Thereby the respective support elements 14 are configured tube-like with a circular cross section or rectangular cross section or elypse-like cross section. In the FIGS. 12*b* to 14*b* and 15*a* to 16*b* the corresponding support elements 14 comprise the fastening means 14.6 already described multiple times in order to secure the wire 13 at the support element 14. The particular of the shown fastening means 14.6 in FIGS. 12*b*, 13*b*, 14*b* is, that the wire is at the same time clamped during back and forth guidance so that the fastening means 14.6 is necessary for the back and forth guided wire 13. With the embodiments from FIGS. 12*a* to 16*b* respectively the electrically conducting core 18 can build the complete support element 14. This is for example possible when for the electrically conducting core 18 an electrically conducting polymer is used like already described. Optionally, it is possible and shown in FIGS. 13*b*, 14*b* and 16*a* that at least an additional or replaceable electrically conducting core 18 is present. In FIGS. 15*b* and 16*b* the support element 14 which is completely configured from an electrically conducting core 18 is covered with an electrically isolating protective cover 14.1 or shrinking tube 14.1. The production of the sensor elements 11, 12 according to the invention with the embodiments from FIGS. 12*b*, 13*b*, 14*b*, 15*a*, 15*b*, 16*a* and 16*b* is particularly simple since the wire 13 only has to be pushed into the respective fastening means 14.6. In this fastening means 14.6 the wire 13 is kept linear at the support element 14. Therewith a particularly simple production of the support element 14 or the respective sensor elements 11, 12 is possible. In FIGS. 15*a*, 15*b*, 16*a* and 16*b* a respective fastening means 14.6 is intended for the forth guidance of the wire 13 and the back guidance of the wire 13 in which the wire 13 has to be pushed in respectively.

The embodiments shown in FIGS. 12*a* to 16*b* of the sensor elements 11, 12 comprise the advantage that they are on the one hand highly flexible and can therewith be assembled at the vehicle in a particularly simple manner and on the other hand can be produced particularly simply. This is particularly simple when the support element 14 predominantly consists of an electrically conducting core 18 which in turn comprises a material from an electrically conducting polymer.

From the previously described figures it results that multiple combinations of the shown technical features are possible. Thus, the cross section area of the support element 14 is not restricted to the shown forms of the cross section. Likewise each of the shown embodiments can be covered with an additional protective cover 14.1. This protective cover 14.1 can consist of a shrinking tube or a coating.

Further it should be mentioned that naturally the sensor unit 10 according to the invention can be used for opening the side doors or the engine flap or the tank cap or suchlike. Instead of the shown sensor element 11 also the sensor element 12 can be used and vice versa. Likewise any combination of the different embodiments of the sensor elements 11 and 12 can be realized with the sensor unit 10.

REFERENCE LIST

10 Sensor unit
11 First sensor element
12 Second sensor element
13 Wire
13.1 Isolation
13.2 Bore
13.3 First edge
13.4 Second edge
13.5 Shield
14 Support element
14.1 Base plate/protective cover
14.2 Level
14.3 Hinge/film hinge
14.4 Lid element
14.5 Catch means
14.6 Fastening means, clamp
14.6*a* Bridge/neck
14.6*b* Hook/mushroom head-like head
14.7 Joint
14.8 Bond bridge
14.9 Recess
14.10 Rib
14.11 Width
14.12 Length
14.13 Support means
14.14 Bend protection
14.15 Longitudinal axis
14.16 Height
14.17 Hump, collection of material
15 Longitudinal direction
16 Shield element
17 Plug
17.1 Contact from 11
17.2 Contact from 12
17.3 Contact from 13.5
18 Core 18.1 Central bridge
18.2 Tines
18.3 Gap
18.4 Predetermined breaking point
19 Gap
19.1 Strain relief
100 Vehicle
101 Hatch or similar
102 Actuating element
110 Security system

The invention claimed is:

1. A sensor unit for actuating an actuating element of a vehicle without contact, comprising: at least one capacitive sensor element, wherein the sensor element comprises a wire which is assembled at a support element, wherein the support element comprises at least one electrically conducting core, wherein the wire is assembled in a U-form at the support element, and wherein the electrically conducting core is configured flatly, wherein the electrically conducting core is capacitively coupled to the wire of the support element.

2. The sensor unit according to claim 1, wherein the wire proceeds mainly in parallel to a longitudinal direction of the support element.

3. The sensor unit according to claim 1, wherein the wire is assembled continuously at the support element.

4. The sensor unit according to claim 1, wherein the wire is provided with an electrical insulation at least in the area of the support element.

5. The sensor unit according to claim 1, wherein the wire is arranged mainly in a single plane relative to the support element.

6. The sensor unit according to claim 1, wherein a part of the wire which is assembled directly at the support element at least comprises a length which is mainly twice as long as the length of the support element.

7. The sensor unit according to claim 1, wherein the electrically conducting core of the support element or the support element itself is mainly covered by a protective cover.

8. The sensor unit according to claim 1, wherein the electrically conducting core is at least configured extensively or that the electrically conducting core itself configures the support element.

9. The sensor unit according to claim 1, wherein the electrically conducting core extends at least mainly about the length of the support element or that the electrically conducting core or the support element comprises joints or predetermined breaking points.

10. The sensor unit according to claim 1, wherein the electrically conducting core is configured comb-like.

11. The sensor unit according to claim 1, wherein the electrically conducting core comprises stainless steel, copper, brass or conductive polymers.

12. The sensor unit according to claim 1, wherein fastening means are assembled at the support element through which the wire is fixed to the support element.

13. The sensor unit according to claim 1, wherein the fastening means mainly encompass the wire so that the wire is assembled at the support element.

14. The sensor unit according to claim 1, wherein at the support element fastening means are provided to serve for guidance of the wire.

15. The sensor unit according to claim 1, wherein the support element covers at least partially or completely the wire, wherein particularly the support element comprises an outer circular or rectangular cross section area.

16. The sensor unit according to claim 1, wherein at least one edge of the support element is enclosed by a cap, wherein at the cap a strain relief is provided.

17. The sensor unit according to claim 1, wherein the support element comprises at least one base plate from which fastening means extend for fixing the wire.

18. The sensor unit according to claim 1, wherein the sensor element is configured flexibly in total with its support element and the wire.

19. The sensor unit according to claim 1, wherein the support element is configured as an injection moulding element from stable plastic wherein at least one joint with at least one bond bridge is assembled in order to achieve a flexibility.

20. The sensor unit according to claim 1, wherein at the support element support means are assembled with which the sensor can be assembled at the vehicle.

21. The sensor unit according to claim 1, wherein at least two capacitive sensor elements form a sensor unit with a common plug.

22. A security system at least for opening or closing a hatch of a vehicle without contact, comprising: at least one sensor unit according to claim 1.

23. The sensor unit according to claim 4, wherein the electrical insulation extends to a plug of the sensor unit.

24. The senor unit according to claim 17, wherein the at least one base plate and the wire is at least partially covered by at least one lid element, wherein the lid element is connected with the base plate in a material locking manner.

25. A method for producing a sensor unit for actuating an actuating element of a vehicle without contact, comprising the steps of:
   forming a capacitive sensor element comprising an electrically conducting core, a support element, and a wire continuously fixed to the support element,
   wherein the sensor unit comprises at least one capacitive sensor element, wherein the wire is assembled in a U-form at the support element, and wherein the electrically conducting core is configured flatly, wherein the electrically conducting, core is capacitively coupled to the wire of the support element.

26. The method according to claim 25, wherein the support element is electrically insulating.

* * * * *